US011934705B2

United States Patent
Pawlowski

(10) Patent No.: US 11,934,705 B2
(45) Date of Patent: *Mar. 19, 2024

(54) TRUTH TABLE EXTENSION FOR STACKED MEMORY SYSTEMS

(71) Applicant: Micron Technology, Inc., Boise, ID (US)

(72) Inventor: Joseph T. Pawlowski, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/099,051

(22) Filed: Jan. 19, 2023

(65) Prior Publication Data

US 2023/0161508 A1    May 25, 2023

Related U.S. Application Data

(63) Continuation of application No. 17/127,785, filed on Dec. 18, 2020, now Pat. No. 11,561,731.

(Continued)

(51) Int. Cl.
*G06F 3/06* (2006.01)
*H01L 25/065* (2023.01)
*H01L 25/18* (2023.01)

(52) U.S. Cl.
CPC .......... *G06F 3/0659* (2013.01); *G06F 3/0604* (2013.01); *G06F 3/0673* (2013.01); *H01L 25/0652* (2013.01); *H01L 25/18* (2013.01)

(58) Field of Classification Search
CPC .... G06F 3/0659; G06F 3/0604; G06F 3/0673; H01L 25/0652; H01L 25/18
See application file for complete search history.

(56) References Cited

U.S. PATENT DOCUMENTS

| 6,526,484 B1 | 2/2003 | Stracovsky et al. |
| 10,593,380 B1 | 3/2020 | Volpe et al. |

(Continued)

FOREIGN PATENT DOCUMENTS

| CN | 114846545 A | 8/2022 |
| CN | 114930282 A | 8/2022 |

(Continued)

OTHER PUBLICATIONS

"International Application Serial No. PCT/US2020/066140, International Preliminary Report on Patentability dated Jul. 7, 2022", 6 pgs.

(Continued)

*Primary Examiner* — Jason W Blust
(74) *Attorney, Agent, or Firm* — Schwegman Lundberg & Woessner, P.A.

(57) ABSTRACT

Techniques for extending a truth table of a stacked memory system are provided. In an example, a storage system can include a stack of first memory die configured to store data and a logic die. The logic die can include an interface circuit configured to receive multiple memory requests from an external host using a first command bus, a second command bus, and a data bus, and a controller configured to interface with the stack of first memory die to store and retrieve the data from the stack of first memory die. The logic die can include a second memory having a faster access time than devices of the stack of first memory die, and the interface circuit can directly access the second memory in response to a first memory request of the multiple of memory requests.

20 Claims, 7 Drawing Sheets

Related U.S. Application Data

(60) Provisional application No. 62/953,819, filed on Dec. 26, 2019.

(56) References Cited

U.S. PATENT DOCUMENTS

| | | | |
|---|---|---|---|
| 11,422,887 | B2 | 8/2022 | Pawlowski |
| 11,455,098 | B2 | 9/2022 | Pawlowski |
| 11,561,731 | B2 | 1/2023 | Pawlowski |
| 2005/0091460 | A1 | 4/2005 | Rotithor et al. |
| 2008/0082730 | A1 | 4/2008 | Kim et al. |
| 2008/0101121 | A1 | 5/2008 | Kreupl |
| 2008/0126716 | A1 | 5/2008 | Daniels |
| 2011/0208906 | A1 | 8/2011 | Gillingham |
| 2012/0063190 | A1 | 3/2012 | Koh |
| 2012/0137040 | A1 | 5/2012 | Kim et al. |
| 2012/0239874 | A1 | 9/2012 | Lee et al. |
| 2012/0290800 | A1 | 11/2012 | Krishnan et al. |
| 2013/0119542 | A1 | 5/2013 | Oh |
| 2014/0006699 | A1 | 1/2014 | Bains et al. |
| 2014/0181415 | A1 | 6/2014 | Loh et al. |
| 2014/0195715 | A1 | 7/2014 | Kim et al. |
| 2015/0100744 | A1 | 4/2015 | Mirichigni et al. |
| 2015/0212738 | A1 | 7/2015 | D, Eliseo et al. |
| 2015/0347226 | A1 | 12/2015 | Pawlowski |
| 2015/0356048 | A1 | 12/2015 | King |
| 2016/0179720 | A1 | 6/2016 | Craddock et al. |
| 2016/0283111 | A1 | 9/2016 | Guo et al. |
| 2018/0047432 | A1 | 2/2018 | Kondo et al. |
| 2018/0189133 | A1 | 7/2018 | Prathapan et al. |
| 2019/0018618 | A1 | 1/2019 | D'eliseo et al. |
| 2019/0034344 | A1 | 1/2019 | Lim |
| 2019/0102330 | A1 | 4/2019 | Hasbun et al. |
| 2019/0114265 | A1 | 4/2019 | Chang et al. |
| 2019/0265909 | A1 | 8/2019 | Frolikov |
| 2019/0278511 | A1 | 9/2019 | Lee et al. |
| 2019/0286586 | A1 | 9/2019 | Minopoli et al. |
| 2020/0058363 | A1 | 2/2020 | Jeddeloh |
| 2020/0065028 | A1 | 2/2020 | Keil et al. |
| 2020/0073809 | A1 | 3/2020 | Trout |
| 2020/0073811 | A1 | 3/2020 | Trout |
| 2021/0117103 | A1 | 4/2021 | Malladi et al. |
| 2021/0200445 | A1 | 7/2021 | Pawlowski |
| 2021/0200475 | A1 | 7/2021 | Pawlowski |
| 2021/0200632 | A1 | 7/2021 | Pawlowski |
| 2022/0391285 | A1 | 12/2022 | Pawlowski |
| 2023/0004305 | A1 | 1/2023 | Pawlowski |

FOREIGN PATENT DOCUMENTS

| | | |
|---|---|---|
| CN | 115427925 A | 12/2022 |
| WO | WO-2019125564 A1 | 6/2019 |
| WO | WO-2021133687 A1 | 7/2021 |
| WO | WO-2021133690 A1 | 7/2021 |
| WO | WO-2021133692 A1 | 7/2021 |

OTHER PUBLICATIONS

"International Application Serial No. PCT/US2020/066140, International Search Report dated Apr. 15, 2021", 4 pgs.

"International Application Serial No. PCT/US2020/066140, Written Opinion dated Apr. 15, 2021", 4 pgs.

"International Application Serial No. PCT/US2020/066192, International Preliminary Report on Patentability dated Jul. 7, 2022", 6 pgs.

"International Application Serial No. PCT/US2020/066192, International Search Report dated Apr. 8, 2021", 3 pgs.

"International Application Serial No. PCT/US2020/066192, Written Opinion dated Apr. 8, 2021", 4 pgs.

"International Application Serial No. PCT/US2020/066208, International Preliminary Report on Patentability dated Jul. 7, 2022", 6 pgs.

"International Application Serial No. PCT/US2020/066208, International Search Report dated Apr. 15, 2021", 3 pgs.

"International Application Serial No. PCT/US2020/066208, Written Opinion dated Apr. 15, 2021", 4 pgs.

Hagedoom, Hilbert, "JEDEC Updates the High Bandwidth Memory Standard (HBM)", [Online]. Retrieved from the Internet: <URL: <https://www.guru3d.com/news-story/jedec-updates-the-high-bandwidth-memory-standard-(hbm).html>>, (Dec. 18, 2018), 3 pgs.

Thornton, Scott, "What is DRAM (Dynamic Random Access Memory) vs SRAM", [Online]. Retrieved from the Internet: <URL: https://www.microcontrollertips.com/dram-vssram/#:~:text=DRAM%20is%20at%20least%20ten,use%20as%20main%20processor%20memory>>, (Jun. 22, 2017), 14 pgs.

"European Application Serial No. 20907393.1, Extended European Search Report dated May 2, 2023", 10 pgs.

"European Application Serial No. 20907692.6, Extended European Search Report dated Dec. 8, 2023", 15 pages.

"European Application Serial No. 20907946.6, Extended European Search Report dated Dec. 19, 2023", 8 pages.

| SRAM FUNCTION | CLK | R0 | R1 | R2 | R3 | R4 | R5 | R6 |
|---|---|---|---|---|---|---|---|---|
| SRAM ACCESS | rising | L | H | L | A13 | A14 | A15 | SID1 |
| | falling | A10 | SID0 | PAR | BA4 | A11 | A12 | D |

*FIG. 4A*

| SRAM FUNCTION | CLK | C0 | C1 | C2 | C3 | C4 | C5 | C6 | C7 | C8 |
|---|---|---|---|---|---|---|---|---|---|---|
| SRAM ACCESS | rising | L | H | Rd/Wrt | A5 | A6 | A7 | A8 | A9 | SID1 |
| | falling | SID0 | A0 | PAR | A1 | A2 | A3 | A4 | BA4 | BFR |

*FIG. 4B*

| SRAM FUNCTION | CLK | R0 | R1 | R2 | R3 | R4 | R5 | R6 |
|---|---|---|---|---|---|---|---|---|
| SRAM ACCESS | rising | L | H | L | A17 | A18 | A19 | A20 |
| | falling | A12 | A13 | PAR | BA4 | A14 | A15 | A16 |

*FIG. 5A*

| SRAM FUNCTION | CLK | C0 | C1 | C2 | C3 | C4 | C5 | C6 | C7 | C8 |
|---|---|---|---|---|---|---|---|---|---|---|
| SRAM ACCESS | rising | L | H | Rd/Wrt | A6 | A7 | A8 | A9 | A10 | A11 |
| | falling | A0 | A1 | PAR | A2 | A3 | A4 | A5 | BA4 | BFR |

*FIG. 5B*

TRUTH TABLE EXTENSION FOR STACKED MEMORY SYSTEMS

PRIORITY AND RELATED APPLICATIONS

This application is a continuation of U.S. application Ser. No. 17/127,785, filed Dec. 18, 2020, which claims the benefit of priority to Pawlowski, U.S. Provisional Patent Application No. 62/953,819, titled, "TRUTH TABLE EXTENSION FOR STACKED MEMORY SYSTEMS, filed Dec. 26, 2019, all of which are hereby incorporated by reference herein in their entirety.

TECHNICAL FIELD

The following relates generally to operating a memory array and more specifically to increasing bandwidth of a device having stacked memory.

BACKGROUND

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random-access memory (RAM), read only memory (ROM), DRAM, synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile.

Improving memory devices, generally, may include increasing memory cell density, increasing read/write speeds, increasing reliability, increasing data retention, reducing power consumption, or reducing manufacturing costs, among other metrics. Advancing memory technology has realized improvements for many of these metrics, however, as improvements in processing speed are developed, memory bandwidth can become a bottleneck to overall system performance improvements.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 4A and 4B illustrate generally an example truth table extension of existing high bandwidth memory protocols to allow access to a second type of random-access memory within a stack of memory die of a high bandwidth memory device.

FIGS. 5A and 5B illustrate generally an example truth table extension of existing high bandwidth memory protocols to allow access to a second type of random-access memory within a stack of random-access memory die.

DETAILED DESCRIPTION

Features of the disclosure introduced above are further described below in the context of an exemplary array (e.g., FIG. 1). Specific examples are then described for various examples or aspects of systems (e.g., FIGS. 2-4).

Figure 1:
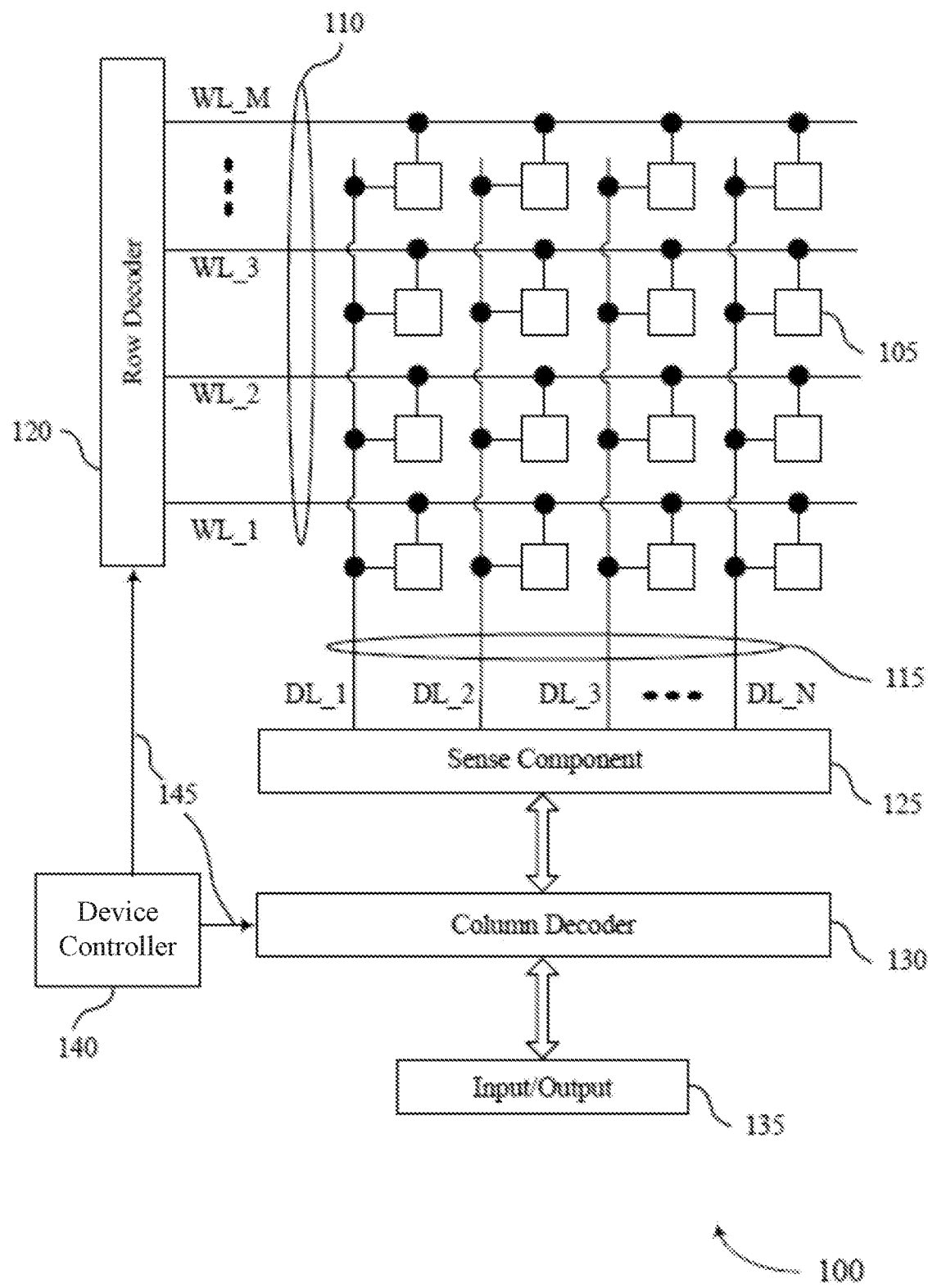
FIG. 1 illustrates an example of a memory die that supports features and operations in accordance with examples of the present disclosure.

FIG. 1 illustrates an example of a memory die 100 in accordance with various aspects disclosed herein. Memory die 100 may also be referred to as an electronic memory apparatus, a memory array, an array of memory cells, or a deck of memory cells, in some examples. The memory die 100 may include memory cells 105 that are programmable to store different states. Memory cells 105 may be arranged in one or more banks of memory cells that may be independently accessible. Each memory cell 105 may be programmable to store two states, denoted as a logic 0 and a logic 1. In some cases, memory cell 105 may be configured to store more than two logic states.

In some examples, a memory cell 105 may store a charge representative of the programmable states in a capacitor; for example, a charged and uncharged capacitor may represent two logic states, respectively. DRAM architectures may use such a design, and the capacitor employed may include a dielectric material with linear or para-electric electric polarization properties as the insulator. FeRAM architectures may also employ such a design. In some examples, a memory cell 105 may store a representation of the programmable states in a cross-coupled inverter configuration. Static RAM (SRAM) architectures may use such a design.

Operations such as reading and writing may be performed on memory cells 105 by activating access line 110 and digit line 115. Access lines 110 may also be known as word lines 110, and bit lines 115 may also be known digit lines 115. References to word lines and bit lines, or their analogues, are interchangeable without loss of understanding or operation. Activating a word line 110 or a digit line 115 may include applying a voltage to the respective line.

According to the example of FIG. 1, each row of memory cells 105 may be connected to a single word line 110, and each column of memory cells 105 may be connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell. Additionally or alternatively, for example, each row of memory cells 105 may be arranged in one or more banks of memory cells.

In some architectures, the logic storing device of a cell, e.g., a capacitor, flip-flop, may be electrically isolated from the digit line by a selection component (not shown). The word line 110 may be connected to and may control the selection component. For example, the selection component may be a transistor and the word line 110 may be connected to the gate of the transistor. Activating the word line 110 may result in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 may receive a column address from the memory controller 140 and activate the appropriate digit line 115. Row decoder 120 and column decoder 130 may receive a row address and a column address, respectively, for a memory cell located within one specific bank of memory cells. Additionally or alternatively, each bank of memory cells may be in electronic communication with a separate row decoder 120 and column decoder 130. For example, memory die 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing a memory cell 105, the cell may be read, or sensed, by sense component 125 to determine the stored state of the memory cell 105. For example, after accessing the memory cell 105, the capacitor of memory cell 105 may discharge onto its corresponding digit line 115. Discharging the capacitor may in some cases result from biasing, or applying a voltage, to the capacitor. The discharging may cause a change in the voltage of the digit line 115, which sense component 125 may compare to a reference voltage (not shown) to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120.

A memory cell 105 may be set, or written, by similarly activating the relevant word line 110 and digit line 115— e.g., a logic value may be stored in the memory cell 105. Column decoder 130 or row decoder 120 may accept data, for example input/output 135, to be written to the memory cells 105. A memory cell 105 may be written by applying a voltage across the capacitor.

The memory controller 140 may control the operation (e.g., read, write, re-write, refresh, discharge, etc.) of memory cells 105 through the various components, for example, row decoder 120, column decoder 130, and sense component 125. Memory controller 140 may be a component of memory die 100 or may be external to memory die 100 in various examples. In some cases, one or more of the row decoder 120, column decoder 130, and sense component 125 may be co-located with the memory controller 140. Memory controller 140 may generate row and column address signals to activate the desired word line 110 and digit line 115. The memory controller 140 may activate the desired word line 110 and digit line 115 of a specific bank of memory cells via at least one channel traversing the memory die 100. Memory controller 140 may also generate and control various voltages or currents used during the operation of memory die 100. For example, it may apply discharge voltages to a word line 110 or digit line 115 after accessing one or more memory cells 105. Memory controller 140 may be coupled to memory cells 105 via channels 145. Channels 145 are illustrated in FIG. 1 as logical connections with row decoder 120 and column decoder 130, but those skilled in the art will recognize that other configurations may be employed. As described herein, memory controller 140 may exchange data (e.g., from a read or write operation) with cells 105 multiple times per clock cycle.

The memory controller 140 may also be configured to communicate commands, data, and other information with a host device (not shown). The memory controller 140 may use a modulation scheme to modulate signals communicated between the memory array and the host device. An I/O interface may be configured based on what type of modulation scheme is selected. In general, the amplitude, shape, or duration of an applied voltage or current discussed herein may be adjusted or varied and may be different for the various operations discussed in operating the memory die 100. Furthermore, one, multiple, or all memory cells 105 within memory die 100 may be accessed simultaneously or concurrently; for example, multiple or all cells of memory die 100 may be accessed simultaneously or concurrently during a reset operation in which all memory cells 105, or a group of memory cells 105, are set to a single logic state.

Figure 2A:
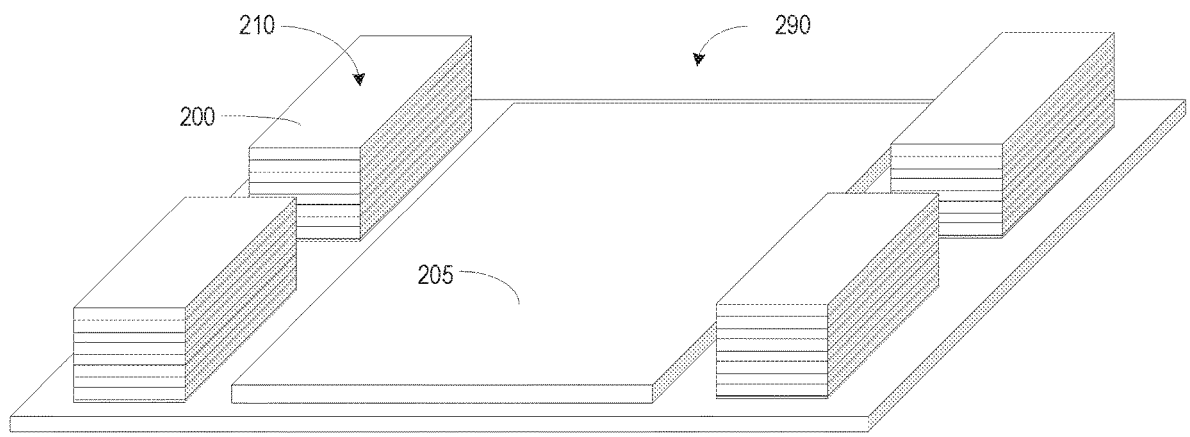
FIGS. 2A and 2B illustrate generally an example of a device that supports features and operations in accordance with examples of the present disclosure.
Figure 2B:
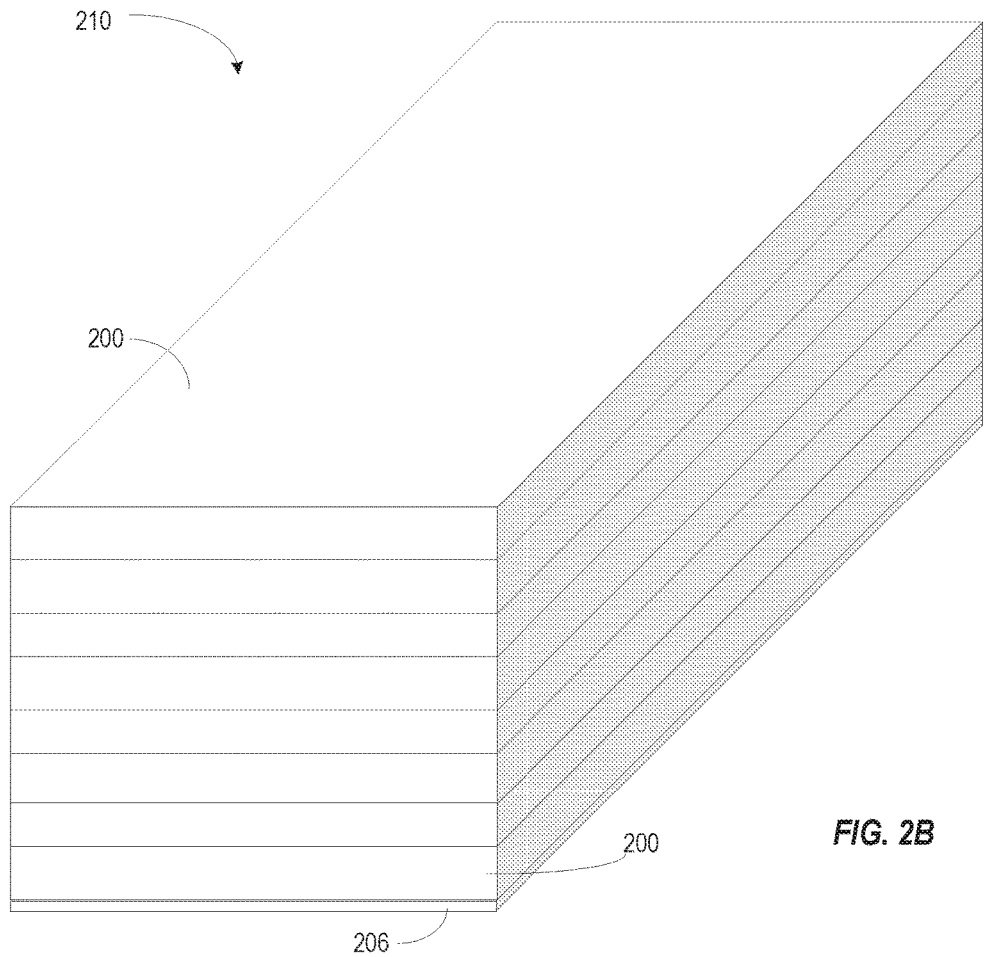

FIG. 2 illustrates an apparatus or system 290 that supports channel routing for a memory device in accordance with various examples disclosed herein. The system 290 may include a host device 205 and a plurality of stacks 210. In conventional systems, the plurality of stacks can include stacked memory die of the same type, such as DRAM memory die. In certain examples, the stacks can include a mix of capacitive based memory devices such as DRAM forming a main memory array, and a faster access memory architecture, for example, a cross-linked inverter memory such a SRAM, which commonly includes four to six transistors per cell, for a second portion of the memory array. In place of DRAM, another storage technology may be used. The present inventor has recognized that bandwidth improvements can be realized if the host has direct access to a second, faster, deterministic type of memory, such as SRAM memory, in addition to the main memory array. Other forms of memory may be used as alternatives to SRAM. In some examples, Ferroelectric RAM (FeRAM) may be utilized in combination with the DRAM; or in other examples non-volatile DRAM devices (such as NVDIMM) combining DRAM and flash memory to provide a non-volatile memory may be used. The greatest benefits to the described systems, at least in terms of speed, will be experienced with a reduced access time memory technology, in combination with the DRAM (or other main memory array storage technology).

The host device 205 may be an example of a processor (e.g., a central processing unit (CPU), a graphics processing unit (GPU)), or a system on a chip (SoC). In some cases, the host device 205 may be a separate component from the memory device such that the host device 205 may be manufactured separately from the memory device. The host device 205 may be external to the stacks 210 (e.g., a laptop, server, personal computing device, smartphone, personal computer). In the system 290, the stacks of memory die 210 may be configured to store data for the host device 205. The described techniques enable direct communication with either the main memory array or the SRAM, as further described below.

The host device 205 may exchange information with the stacks of memory die 210 using signals communicated over signal paths. A signal path may be a path that a message or transmission may take from a transmitting component to a receiving component. In some cases, a signal path may be a conductor coupled with at least two components, where the conductor may selectively allow electrons to flow between the at least two components. The signal path may be formed in a wireless medium as in the case for wireless communications (e.g., radio frequency (RF) or optical). The signal paths may at least partially include a first substrate, such as an organic substrate of the memory device, and/or a second substrate, such as a package substrate (e.g., a second organic substrate) that may be coupled with at least one, if not both, of the stacks 210 and the host device 205. In some cases, the stacks 210 may function as a slave-type device to the host device 205, which may function as a master-type device.

In some applications, the system 290 may benefit from a high-speed connection between the host device 205 and the memory devices 210. As such, some stacks 210 support applications, processes, host devices, or processors that have multiple terabytes per second (TB/s) bandwidth needs. Satisfying such a bandwidth constraint within an acceptable energy budget may pose challenges in certain contexts.

The memory dies 200 of the stacks 210 may be configured to work with multiple types of communication mediums 211 (e.g., substrates such as organic substrates and/or high-density interposers such as silicon interposers). The host device 205 may, in some cases, be configured with an interface or ball-out comprising a design (e.g., a matrix or pattern) of terminals.

In some cases, a buffer layer may be positioned between the memory dies 200 and the communication medium 211. The buffer layer may be configured to drive (e.g., redrive) signals to and from the memory dies 200. In some cases, the stacks 210 of memory dies 200 may be bufferless meaning that either no buffer layer is present or that a base layer does not include re-drivers, among other components. In certain examples of bufferless memory, a routing layer or logic die 206 may be positioned between the memory die 200, or stack of memory die 200 and the communication medium 211. In certain examples, the logic die 206 can form a lower layer of a memory die 200. In certain examples, a bufferless memory stack 210 can include a lower most memory die 200 having a logic die layer 206.

Figure 3:
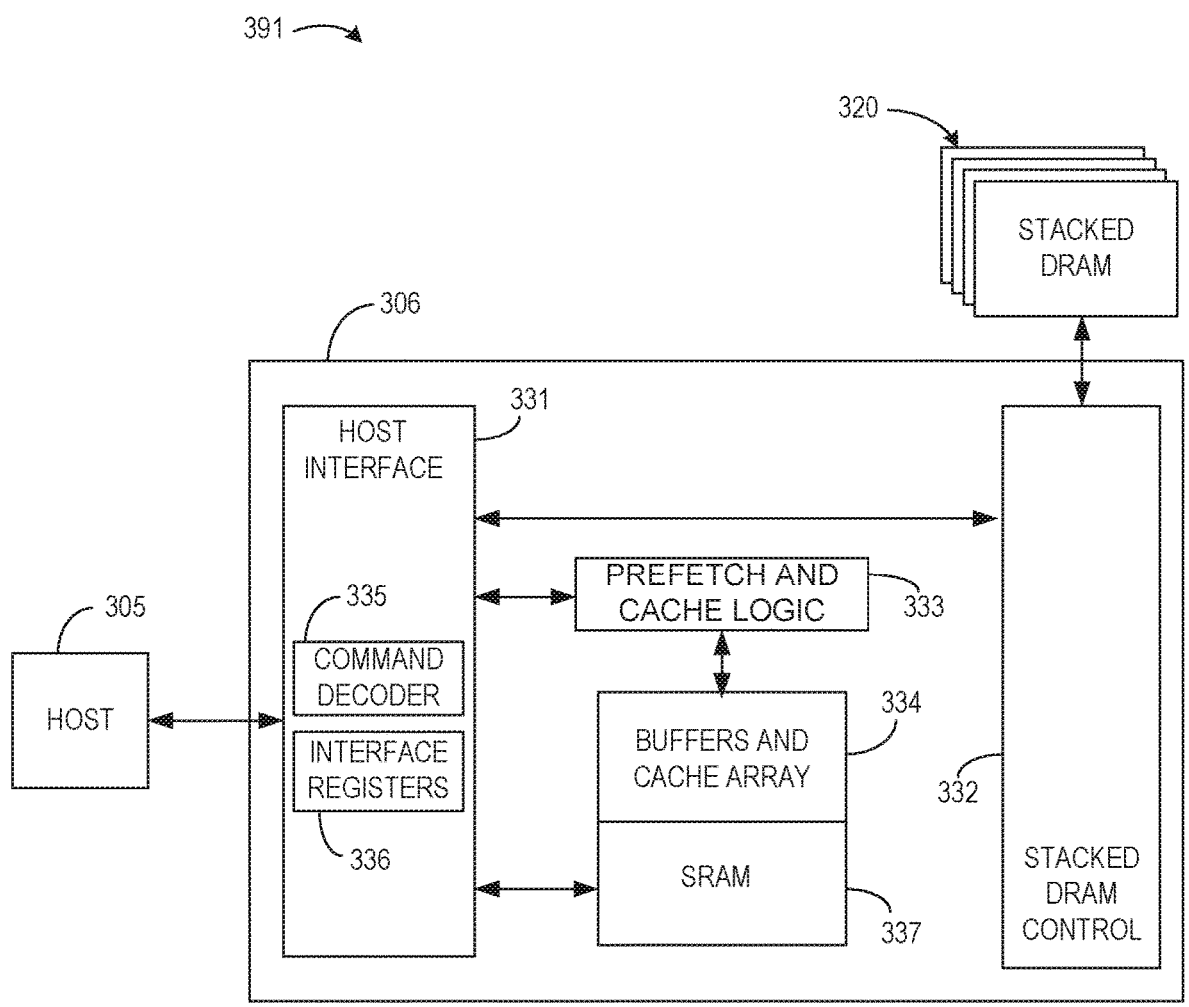
FIG. 3 illustrates generally an example storage system including a host device that can request and receive information from the storage system according to the present subject matter.

FIG. 3 illustrates generally an example storage system 391 including a host device 305 that can request and receive information from a storage system 310 according to the present subject matter. The host device 305 may be, but is not limited to, a CPU, graphics processing unit (GPU), accelerated processing unit (GPU), digital signal processor (DSP), field-programmable gate array (FPGA), application specific integrated circuit (ASIC) and any other component of a larger system that communicates with the storage system 310. In some embodiments, the device 305 may be multiple devices accessing the same storage system 310. The storage system 310 can include a logic die 306 integrated with a memory stack 320, such as a stack of dynamic random-access memory (DRAM) devices.

The logic die 306 can include a host interface 331 connected to a stacked DRAM control 332 and prefetch and cache logic 333. The stacked DRAM control 332 is connected to and interfaces with the memory stack 320. The prefetch and cache logic 333 can be connected with a prefetcher, prefetch buffers and a cache array 334. The prefetcher may be a hardware prefetcher. The prefetch buffers and cache array 334 may be, but is not limited to, an SRAM array, any other memory array technology, or a register.

The host interface 331 can include a command decoder 335 and interface registers 336. The host interface 331, and more specifically, the command decoder 335 can receive all incoming memory requests to the memory stack 320 from the device 305. The requests can be sent to the prefetch and cache logic 333, (for example, next-line, stride, and the like). The prefetch and cache logic 333 can monitor the incoming memory requests. Prefetched data can be placed into the prefetch buffers and cache array 334. The prefetch and cache logic 333 can also check any incoming memory requests against the data in the prefetch buffers and cache array 334. Any hits can be served directly from the prefetch buffers and cache array 334 without going to the stacked DRAM control 332. This can reduce service latencies for these requests, as well as reduce contention in the stacked DRAM control 332 of any remaining requests, (i.e., those that do not hit in the prefetch buffers and cache array 334).

The prefetcher may encompass any prefetching algorithm/method or combination of algorithms/methods. Due to the row-buffer-based organization of most memory technologies, (for example, DRAM), prefetch algorithms that exploit spatial locality, (for example, next-line, small strides and the like), have relatively low overheads because the prefetch requests will (likely) hit in the memory's row buffer(s). Implementations may issue prefetch requests for large blocks of data, (i.e., more than one 64B cache line's worth of data), such as prefetching an entire row buffer, half of a row buffer, or other granularities.

The prefetch buffers and cache array 334 may be implemented as a direct-mapped, set-associative, to a fully-associative cache-like structure. In an embodiment, the prefetch buffers and cache array 334 may be used to service only read requests, (i.e., writes cause invalidations of prefetch buffer entries, or a write-through policy must be used). In another embodiment, the prefetch buffers and cache array 334 may employ replacement policies such as Least Recently Used (LRU), Least Frequency Used (LFU), or First In First Out (FIFO). If the prefetch unit generates requests for data sizes larger than a cache line, (as described hereinabove), the prefetch buffers and cache array 334 may also need to be organized with a correspondingly wider data block size. In some embodiments, sub-blocking may be used.

While described herein as being employed in a memory organization consisting of one logic chip and one or more memory chips, there are other physical manifestations. Although described as a vertical stack of a logic die with one or more memory chips, another embodiment may place some or all of the logic on a separate chip horizontally on an interposer or packaged together in a multi-chip module (MCM). More than one logic chip may be included in the overall stack or system.

In certain examples, the host interface 331 can directly access a portion of the buffers and cache array 334 or can directly access a separate instance of SRAM-type memory 337. In such examples, the command decoder 335 is responsive to a command truth table that includes commands that extend beyond accessing and servicing the DRAM memory stack 320. More specifically, the command decoder 335 can be responsive to commands for directly accessing SRAM-type storage located 337 on the logic die 306. As used herein, SRAM-type memory includes memory that has less latency than the DRAM memory of the storage system. In such memory, information can be accessed with less latency than information stored at the stacked memory 320. In certain examples, directly accessing an instance of, for example, SRAM 337 at the logic die 306, information can be accessed with less latency than information available at the prefetch buffers or cache array 334 via the prefetch and cache logic 333.

FIGS. 4A and 4B illustrate generally an example truth table extension of existing high bandwidth memory protocols to allow access to a second type of random-access memory within a stack of random-access memory dies. Such stacks can be used in high bandwidth memory packages. In certain examples, systems adapted to operate with a memory stack including a mix of DRAM and faster SRAM can also work with conventional memory stack systems that include a homogeneous stack of memory die. The present inventor has recognized that unused states of existing interface protocols can be exploited to allow for a memory controller to specifically command and control the faster memory so as to improve overall storage system bandwidth. In certain examples, each channel can provide independent access to an area of memory of the memory stack. In certain examples, each channel can act independent of another channel. Each channel can include an independent command and data interface. In certain examples, each command and data interface can include a number signals or terminations including data (DQ[$N_D$:0]), column command/address (C[$N_C$:0]) and row command/address (R[$N_R$:0]) among others, where $N_D$, $N_C$ and $N_R$ can be the maximum signal address of the respective group or bus of signals or terminations. In certain examples, specific operations of a stack of memory die can be initiated by properly setting the respective signals of the row command/address and column command/address while receiving a clock signal. Conventional operations of DRAM stacks use the first few signals (R[3:0] of the row command/address signals and the first few signal (C[3:0]) of the column command/address signals to initiate various operations of the stack of DRAM devices. In certain examples, the channels couple an interface of the memory controller with a device interface and device control circuitry of one or more of the memory die in the stack.

In certain examples, where the stack of memory die includes one or more SRAM arrays, the memory controller can access the SRAM arrays using an extension of the conventional row and column command truth tables, such as the row and column truth tables provided in JEDEC Standard No. 235B. FIG. 4A illustrates generally an example row command truth table extension. FIG. 4B illustrates generally a column truth table extension. In certain examples, unlike conventional methods, the row and column command/address signals can work in tandem to initiate individual operations to access the one or more SRAM arrays within the stack of memory die.

As an example, upon receiving a rising clock signal and additional signals on the row command/address where R0-R2 are logic "high" (H), "low" (L), H, respectively, the memory device controller of an SRAM device can recognize that the memory controller is requesting access to the SRAM device. The remaining row command/address signals, as well as the column command/address signals, can provide additional information to confirm the SRAM access request, provide address information, and specific command information such as whether the request is a read request, write request and whether or not the request is to use a buffer for the data. Referring to FIG. 4A, signals or terminations R3-R5 on the riding edge of the clock signal, and R0, R4 and R5 on the falling edge of the clock signal can provide a portion of the SRAM address (A10-A15) for the requested SRAM access. The "D" at R6 on the falling edge of the clock (CLK) stands for "Do Not Care" and indicates the logic level is not relevant for the illustrated example. Referring to FIG. 3B, signals of the column command/address interface of the same channel, including C3-C7 on the rising edge of the clock, and C1 and C3-C6 on the falling edge of the clock signal can provide the rest of the SRAM address (A0-A9) for the requested SRAM access. On the rising edge of the clock signal, C0 and C1 can verify that the command address information provided to the memory controller is a SRAM access request when C0 is set "low" and C1 is set "high". Also, on the rising edge, the state of C2 can indicate whether the access is a "read" access or a "write" access. SID0 and SID1 can indicate a stack identification of the device for the SRAM access command.

Existing stacked DRAM devices can operate in a number of modes. Some modes have been added as the stacked DRAM technology has evolved. In certain examples, one such mode of operation is generally referred to a pseudo channel mode. Pseudo channel mode can divide a channel into two individual sub channels or pseudo channels. Both pseudo channels can operate semi-independently. The pseudo channels can share the channel's row command/address bus and column command/address bus, however, each pseudo channel can execute and decode commands individually. Command/address signal BA4 can be used to direct a SRAM access command to one of the two pseudo channels. In certain examples, the command information can include a parity bit (PAR) that can be used to insure the command information on ether the row command/address interface or the column command address interface did not get corrupted before being received by the memory controller.

In certain examples, SRAM and DRAM access commands can be isolated from the external bus connecting the host with the host interface. In such examples, a memory access command does not provide read data to the external bus or receive write data from the external bus, but instead, uses an internal buffer, such as a prefetch buffer or similar register to capture data read from SRAM or Stacked DRAM and to provide data for an SRAM write or a stacked DRAM write command. In such examples, column command address signal C8, on a falling edge of the clock signal, can provide a binary state to indicate whether the internal buffer or the external bus is to be used as the data target of a memory access command. In certain examples, a column command/address bit, such as the C8 bit can be used, on the falling edge of the clock signal (CLK) to indicate to the memory controller or the command decoder of the host interface, the data location to use for the direct SRAM or stacked DRAM access command. In a first state, the C8 bit can indicate the memory controller can use the external data bus as the data location for the memory access command. In a second state, the C8 bit can indicate that the memory controller can use an internal buffer as the data location for the memory access command.

FIGS. 5A and 5B illustrate generally an example truth table extension of existing high bandwidth memory protocols to allow access to a second type of random-access memory within a stack of random-access memory die. Such stacks can be used in high bandwidth memory packages. The example of FIGS. 5A and 5B allow for a larger capacity SRAM than can be addressed by the example of FIGS. 4A and 4B.

As an example, upon receiving a rising clock signal and additional signals on the row command/address where R0-R2 are logic "high" (H), "low" (L), H, respectively, the memory device controller of an SRAM device can recognize that the memory controller is requesting access to the SRAM device. The remaining row command/address signals, as well as the column command/address signals, can provide additional information to confirm the SRAM access request, provide address information, and specific command information such as whether the request is a read request, write request and whether or not the request is to use a buffer for the data. Referring to FIG. 5A, signals or terminations R3-R5 on the riding edge of the clock signal, and R0, R4 and R5 on the falling edge of the clock signal can provide a portion of the SRAM address (A12-A20) for the requested SRAM access. Referring to FIG. 3B, signals of the column command/address interface of the same channel, including C3-C7 on the rising edge of the clock, and C1 and C3-C6 on the falling edge of the clock signal can provide the rest of the SRAM address (A0-A11) for the requested SRAM access. On the rising edge of the clock signal, C0 and C1 can verify that the command address information provided to the memory controller is a SRAM access request when C0 is set "low" and C1 is set "high". Also, on the rising edge, the state of C2 can indicate whether the access is a "read" access or a "write" access.

Existing stacked DRAM die can operate in a number of modes. Some modes have been added as the stacked DRAM technology has evolved. In certain examples, one such mode of operation is generally referred to a pseudo channel mode. Pseudo channel mode can divide a channel into two individual sub channels or pseudo channels. Both pseudo channels can operate semi-independently. The pseudo channels can share the channel's row command/address bus and column command/address bus however, each pseudo channel can execute and decode commands individually. Command/address signal BA4 can be used to direct a SRAM access command to one of the two pseudo channels. In certain examples, the command information can include a parity bit (PAR) that can be used to insure the command information on ether the row command/address interface or the column command address interface did not get corrupted before being received by the memory controller.

In certain examples, SRAM and DRAM access commands can be isolated from the external bus connecting the host with the host interface. In such examples, a memory access command does not provide read data to the external bus or receive write data from the external bus, but instead, uses an internal buffer, such as a prefetch buffer or similar register to capture data read from SRAM or Stacked DRAM and to provide data for an SRAM write or a stacked DRAM write command. In such examples, column command address signal C8, on a falling edge of the clock signal, can provide a binary state to indicate whether the internal buffer or the external bus is to be used as the data target of a memory access command. In certain examples, a column command/address bit, such as the C8 bit can be used, on the falling edge of the clock signal (CLK) to indicate to the memory controller or the command decoder of the host interface, the data location to use for the direct SRAM or stacked DRAM access command. In a first state, the C8 bit can indicate the memory controller can use the external data bus as the data location for the memory access command. In a second state, the C8 bit can indicate that the memory controller can use an internal buffer as the data location for the memory access command.

Figure 6:
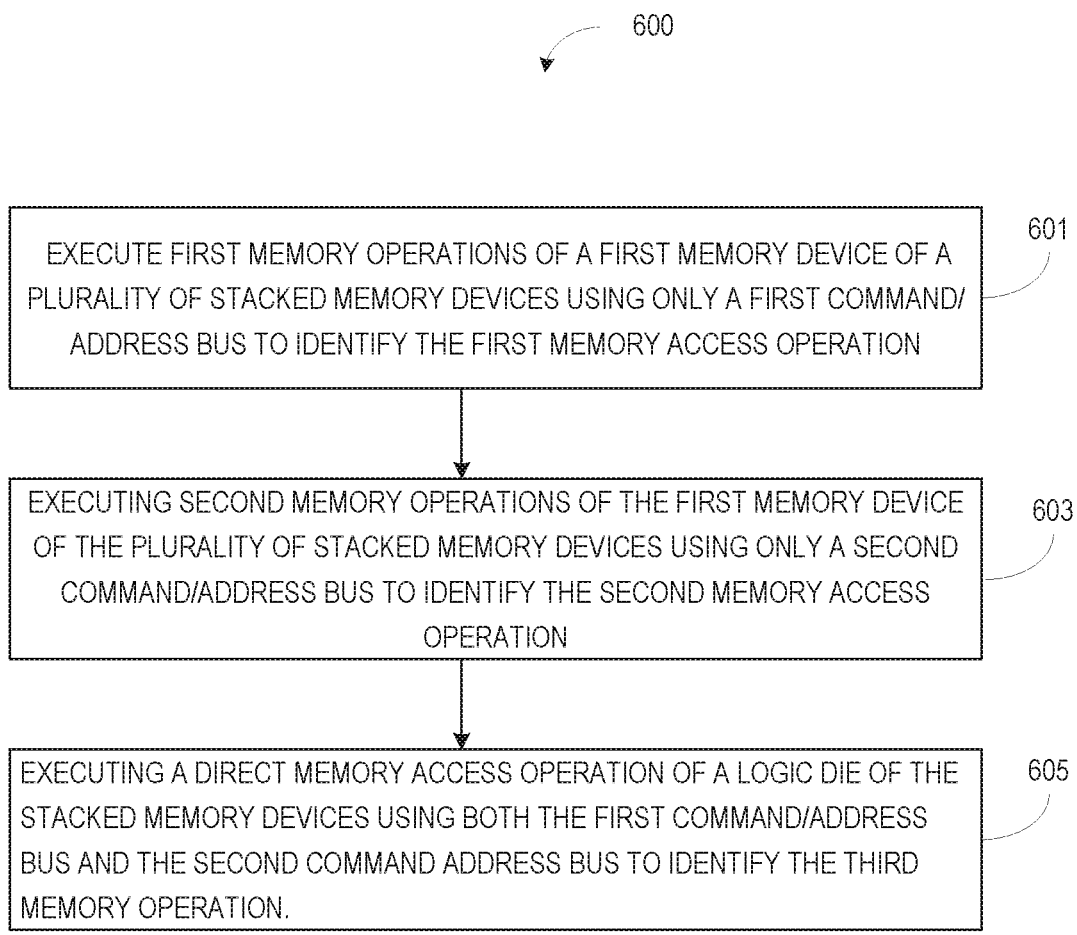
FIG. 6 illustrates generally a flowchart of an example method for operating a storage system including a stack of first memory.

FIG. 6 illustrates generally a flowchart of an example method 600 for operating a storage system including a stack of first memory. In certain examples, the storage system can include a logic die, a memory controller, a first interface and a second interface. The logic die can receive and decode requests received from the host via the first interface. The logic die can initiate data access of the storage system via the memory controller of the stack of first memory, via a cache, via a second memory of the logic die, or combinations thereof. In some examples, the first memory can include DRAM die coupled to the memory controller via the second interface. In some examples, the second memory can be SRAM memory. The logic die may or may not include the memory controller. In certain examples, the memory controller can reside as a separate controller on each of the memory die of the stack of memory die. At 601, first memory operations of the first memory can be initiated and executed using only a first command/address bus of the first interface to identify the first memory operations. In certain examples, the first command address bus can be the row command address bus associated with, for example, high bandwidth memory devices. In some examples, the first memory operations do not include read operations or write operation. In some examples, the first memory operations include pre-charge operations, refresh operations, power down operations or combinations thereof.

At 603, second memory operations of the first memory can be initiated and executed using only a second command/address bus of the first interface to identify the second memory access operation. In certain examples, the second command address bus can be the column command/address bus associated with, for example, high bandwidth memory devices. In some examples, the second memory operations include read operations or write operations. At 605, a third memory access operation, of the second memory, such as an SRAM array of the logic die, can be initiated or executed using both the first command/address bus and the second command address bus to identify the third memory operation. In certain examples, the first memory can be a capacitive based random-access memory device such as a DRAM and the second memory can be SRAM. Having direct access to faster SRAM-type memory in a stacked DRAM storage system can provide opportunities for improved bandwidth of the storage system compared to conventional stacked DRAM memory or storage systems.

In certain examples, in addition to providing new commands for directly accessing, for example, SRAM device within a storage system including a stack of DRAM memory devices, and without violating standards for implementing stacked DRAM high bandwidth storage systems, the present subject matter can also allow internal data movement between the DRAM memory and the SRAM memory using a buffer of the logic die and the extended command truth table, instead of requiring the information to be transferred via the host interface bus. Such internal transfer commands can be implemented by setting a bit of the second command/address bus to a particular state on a second transition of a clock of the second command/address bus. In some examples, the bit to allow movement between memory and a buffer can be the C8 bit of the column command/address bus associated with high bandwidth memory devices.

In certain examples, modification of the command truth table for a stack of random access memory (RAM) as disclosed herein can allow direct access to a different type of RAM within a logic die of the stack, such as an SRAM memory in a stacked DRAM storage system and can provide specific commands to directly access and utilize the benefits of the SRAM. Such commands can allow for the ability of a memory controller to read or write the SRAM using the external data bus, read and write the SRAM using a buffer internal to the storage system, read and write the DRAM using the external bus, and read and write the DRAM using the buffer. In certain examples, commands that use the buffer as the data location do not affect the data bus of the channel (e.g., the external data bus) associated with the memory addressed in the command/operation and can allow the data bus to be used for other operations.

In certain examples, a storage system according to the present subject matter can provide an increase in bandwidth for high bandwidth memory without passing the stress of the bandwidth increase to for example, the performance limited conventional memory of a conventional high bandwidth device. In some examples, the bandwidth increase can be achieved without modification of the pinout of the existing high bandwidth memory package.

Figure 7:
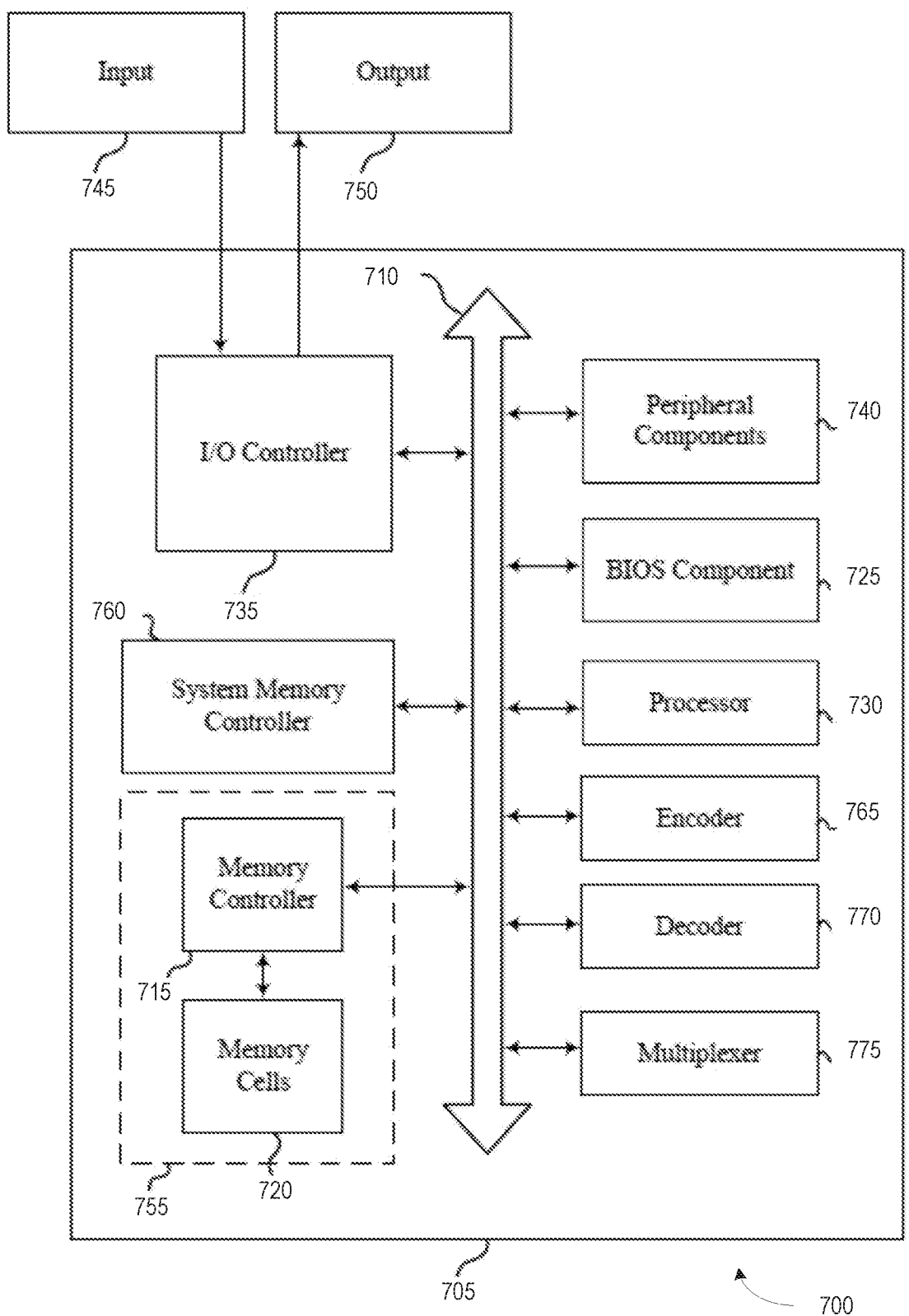
FIG. 7 illustrates generally a diagram of a system including a device that supports a storage system including stacked DRAM in accordance with aspects disclosed herein.

FIG. 7 illustrates generally a diagram of a system 700 including a device 705 that supports a storage system including stacked DRAM in accordance with aspects disclosed herein. Device 705 may include components for bi-directional voice and data communications including components for transmitting and receiving communications, including memory controller 715, memory cells 720, basic input/output system (BIOS) component 725, processor 730, I/O controller 735, peripheral components 740, memory chip 755, system memory controller 760, encoder 765, decoder 770, and multiplexer 775. These components may be in electronic communication via one or more busses (e.g., bus 710). Bus 710, for example, may have a bus width of 16 data lines ("DQ" lines). Bus 710 may be in electronic communication with 32 banks of memory cells.

Memory controller 715 or 760 may operate one or more memory cells as described herein. Specifically, memory controller may be configured to support flexible multi-channel memory. In some cases, memory controller 715 or 760 may operate a row decoder, column decoder, or both, as described with reference to FIG. 1. Memory controller 715 or 760 may be in electronic communication with a host and may be configured to transfer data during each of a rising edge and a falling edge of a clock signal of the memory controller 715 or 760.

Memory cells 720 may store information (i.e., in the form of a logical state) as described herein. Memory cells 720 may represent, for example, memory cells 105 described with reference to FIG. 1. Memory cells 720 may be in electronic communication with memory controller 715 or 760, and memory cells 720 and memory controller 715 or 760 may be located on a chip 755, which may be one or several planar memory devices as described herein. Chip 755 may, for example, be managed by system memory controller 715 or 760.

Memory cells 720 may represent a first array of memory cells with a plurality of regions coupled to a substrate. Each region of the plurality of regions may include a plurality of banks of memory cells and a plurality of channels traversing the first array of memory cells. At least one of the plurality of channels may be coupled to at least one region. Memory controller 715 or 760 may be configured to transfer data between the coupled region and the memory controller 715 or 760.

BIOS component 725 be a software component that includes BIOS operated as firmware, which may initialize and run various hardware components. BIOS component 725 may also manage data flow between a processor and various other components, e.g., peripheral components, input/output control component, etc. BIOS component 725 may include a program or software stored in read only memory (ROM), flash memory, or any other non-volatile memory.

Processor 730 may include an intelligent hardware device, (e.g., a general-purpose processor, a digital signal processor (DSP), a central processing unit (CPU), a microcontroller, an application-specific integrated circuit (ASIC), a field programmable gate array (FPGA), a programmable logic device, a discrete gate or transistor logic component, a discrete hardware component, or any combination thereof). In some cases, processor 730 may be configured to operate a memory array using a memory controller 715 or 760. In other cases, a memory controller 715 or 760 may be integrated into processor 730. Processor 730 may be configured to execute computer-readable instructions stored in a memory to perform various functions (e.g., functions or tasks supporting flexible multi-channel memory).

I/O controller 735 may manage input and output signals for device 705. I/O controller 735 may also manage peripherals not integrated into device 705. In some cases, I/O controller 735 may represent a physical connection or port to an external peripheral. I/O controller 735 may utilize an operating system such as iOS®, ANDROID®, MS-DOS®, MS-WINDOWS®, OS/2®, UNIX®, LINUX®, or another known operating system. In other cases, I/O controller 735 may represent or interact with a modem, a keyboard, a mouse, a touchscreen, or a similar device. In some cases, I/O controller 735 may be implemented as part of a processor. A user may interact with device 705 via I/O controller 735 or via hardware components controlled by I/O controller 735.

Peripheral components 740 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 745 may represent a device or signal external to device 705 that provides input to device 705 or its components. This may include a user interface or an interface with or between other devices. In some cases, input 745 may be managed by I/O controller 735, and may interact with device 705 via a peripheral component 740.

Output 750 may also represent a device or signal external to device 705 configured to receive output from device 705 or any of its components. Examples of output 750 may include a graphics display, audio speakers, a printing device, another processor or printed circuit board, etc. In some cases, output 750 may be a peripheral element that interfaces with device 705 via peripheral component(s) 740. Output 750 may be managed by I/O controller 735.

System memory controller 715 or 760 may be in electronic communication with a first array of memory cells (e.g., memory cells 720). A host may be a component or device that controls or directs operations for a device of which memory controller 715 or 760 and corresponding memory array are a part. A host may be a component of a computer, mobile device, or the like. Or device 705 may be referred to as a host. In some examples, system memory controller 715 or 760 is a GPU.

Encoder 765 may represent a device or signal external to device 705 that provides performs error correction encoding on data to be stored to device 705 or its components. Encoder 765 may write the encoded data to the at least one selected memory via the at least one channel and may also encode data via error correction coding.

Decoder 770 may represent a device or signal external to device 705 that sequences command signals and addressing signals to device 705 or its components. In some examples, memory controller 715 or 760 may be co-located within decoder 770.

Multiplexer 775 may represent a device or signal external to device 705 that multiplexes data to device 705 or its components. Multiplexer 775 may multiplex the data to be transmitted to the encoder 765 and de-multiplex data received from the encoder 765. A multiplexer 775 may be in electronic communication with the decoder 770. In some examples, multiplexer 775 may be in electronic communication with a controller, such as system memory controller 715 or 760.

The components of device 705 may include circuitry designed to carry out their functions. This may include various circuit elements, for example, conductive lines, transistors, capacitors, inductors, resistors, amplifiers, or other active or inactive elements, configured to carry out the functions described herein. Device 705 may be a computer, a server, a laptop computer, a notebook computer, a tablet computer, a mobile phone, a wearable electronic device, a personal electronic device, or the like. Or device 705 may be a portion or aspect of such a device. In some examples, device 705 is an aspect of a computer with high reliability, mission critical, or low latency constraints or parameters, such as a vehicle (e.g., an autonomous automobile, airplane, a spacecraft, or the like). Device 705 may be or include logic for artificial intelligence (AI), augmented reality (AR), or virtual reality (VR) applications.

In one example, a memory device may include an array of memory cells with a plurality of regions that may each may include a plurality of banks of memory cells, and a plurality of channels traversing the array of memory cells. Each of the channels may be coupled with a region of the array of memory cells and may be configured to communicate signals between the plurality of banks of memory cells in the region with a host device.

In some examples, the memory device may further include I/O areas extending across the array of memory cells, the I/O areas occupying an area of the array of memory cells that may be devoid of memory cells. In some examples of the memory device, the I/O areas may include TSVs configured to couple the array of memory cells with a power node or a ground node.

In some examples, the memory device may further include a plurality of channel interfaces distributed in the array of memory cells. In some examples of the memory device, the plurality of channel interfaces may be bumpouts. In some examples of the memory device, a channel interface of the plurality of channel interfaces may be positioned in each quadrant of the array of memory cells.

In some examples, the memory device may further include a plurality of signal paths extending between memory cells of the region and a channel interface associated with the region. In some examples of the memory device, the channel interface may be positioned in the array of memory cells to minimize a length of the signal paths.

In some examples, the memory device may further include a second array of memory cells stacked on top of the array of memory cells. In some examples of the memory device, the second array of memory cells may have regions that may each include a plurality of banks of memory cells. In some examples, the memory device may further include a second plurality of channels traversing the second array of memory cells. In some examples of the memory device, each of the channels of the second plurality of channels may be coupled with a second region of the second array of memory cells and may be configured to communicate signals between the plurality of banks of memory cells in the second region with the host device.

In some examples, the memory device may further include TSVs extending through the array of memory cells to couple the second array of memory cells with the second plurality of channels. In some examples of the memory device, a channel may establish a point-to-point connection between the region and the host device. In some examples of the memory device, each channel may include four or eight data pins. In some examples of the memory device, the region of the array of memory cells may include eight or more banks of memory cells.

In some examples, the memory device may further include an interface configured for bidirectional communication with the host device. In some examples of the memory device, the interface may be configured to communicate signals modulated using at least one of a NRZ modulation scheme or a PAM4, or both.

In one example, a memory device may include an array of memory cells with regions that each include a plurality of banks of memory cells, I/O areas extending across the array of memory cells, the I/O areas may include a plurality of terminals configured to route signals to and from the array of memory cells, and a plurality of channels positioned in the I/O areas of the array of memory cells, each of the channels may be coupled with a region of the array of memory cells and may be configured to communicate signals between the plurality of banks of memory cells in the region with a host device.

In some examples, the memory device may further include a plurality of channel interfaces positioned in the I/O areas of the array of memory cells, signal paths couple the regions with the plurality of channel interfaces. In some examples of the memory device, the I/O areas may include TSVs configured to couple a second array of memory cells stacked on top of the array of memory cells with a channel interface.

In some examples of the memory device, a channel interface of the region may be positioned within an I/O area that bisects the region serviced by the channel interface. In some examples of the memory device, the I/O areas may include TSVs configured to couple the array of memory cells with a power node or a ground node. In some examples of the memory device, the I/O areas may occupy an area of the array of memory cells that may be devoid of memory cells. In some examples of the memory device, the array of memory cells may be bisected by two I/O areas. In some examples of the memory device, the array of memory cells may be bisected by four I/O areas.

In one example, a system may include a host device, a memory device including a memory die with a plurality of regions that may each include a plurality of banks of memory cells, and a plurality of channels configured to communicatively couple the host device and the memory device, each of the channels may be coupled with a region of the memory die and may be configured to communicate signals between the plurality of banks of memory cells in the region with the host device.

In some examples, the system may include an interface configured for bidirectional communication with the host device. In some examples of the system, the interface may be configured to communicate signals modulated using at least one of a NRZ modulation scheme or a PAM4 scheme, or both. In some examples of the system, the host device may be an example of a GPU. In some examples of the system, the memory device may be positioned in a same package as the host device.

In one example, a memory device may include an array of memory cells with a plurality of regions that each include a plurality of banks of memory cells, and a plurality of channels traversing the array of memory cells, each of the channels may be coupled to at least one region of the array of memory cells and each channel may include two or more data pins and one or more command/address pin.

In some examples of the memory device, each channel may include two data pins. In some examples of the memory device, each channel may include one command/address pin. In some examples of the memory device, each region of the array may include four banks of memory cells. In some examples of the memory device, each channel may include four data pins. In some examples of the memory device, each channel may include two command/address pins. In some examples of the memory device, each region of the array may include eight banks of memory cells. In some examples of the memory device, each bank of memory cells may be contiguous with a channel.

In some examples of the memory device, a first set of banks of each plurality may be contiguous with a channel and a second set of banks of each plurality may be contiguous with another bank and non-contiguous with a channel. In some examples, the memory device may include 128 data pins and configured with a ratio of two, four, or eight data pins per channel.

In some examples, the memory device may include one, two, three, four, or six command/address pins per channel. In some examples, the memory device may include 256 data pins and configured with a ratio of two, four, or eight data pins per channel. In some examples, the memory device may include one, two, three, four, or six command/address pins per channel. In some examples of the memory device, the array may include a plurality of memory dice that each may include a plurality of channels.

In some examples of the memory device, each memory die of the plurality may be coupled with a different channel of the plurality of channels. In some examples, the memory device may include a buffer layer coupled with array. In some examples, the memory device may include an organic substrate underlying the array.

In some examples of the memory device, the array may be configured for a pin rate of 10, 16, 20, or 24 Gbps. In some examples, the memory device may include an interface configured for bidirectional communication with a host device. In some examples of the memory device, the interface may be configured for at least one of a binary modulation signaling or pulse-amplitude modulation, or both.

In one example, a system may include at least one memory die that may include a plurality of regions that each may include a plurality of banks of memory cells, one or more channels associated with each memory die, each of the channels may be coupled to at least one region of the die of memory cells and each channel may include two or more data pins, and an organic substrate that underlies the memory die.

In some examples, the system may include a host device, and an interface configured for bidirectional communication with the host device, the interface supports at least one of a NRZ signaling or a PAM4, or both. In some examples of the system, the host device may include a GPU.

In some examples, the system may include a plurality of memory arrays that each may include 128 or 256 data pins and configured with a ratio of two, four, or eight data pins per channel. In some examples, the system may include a buffer layer positioned between the at least one memory die and the organic substrate.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As may be used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The may be used herein, the term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "layer" used herein refers to a stratum or sheet of a geometrical structure. Each layer may have three dimensions (e.g., height, width, and depth) and may cover some or all of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of a memory array.

The term "isolated" refers to a relationship between components in which electrons are not presently capable of flowing between them; components are isolated from each other if there is an open circuit between them. For example, two components physically connected by a switch may be isolated from each other when the switch is open.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. In some examples, the substrate may be an organic build up substrate formed from materials such as ABF or BT. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine.

A processor may also be implemented as a combination of computing devices (e.g., a combination of a DSP and a microprocessor, multiple microprocessors, one or more microprocessors in conjunction with a DSP core, or any other such configuration).

In a first example, Example 1, a storage system can include a stack of first memory die configured to store data; and a logic die including an interface circuit configured to receive multiple memory requests from an external host using a first command bus, a second command bus, and a data bus, and a controller configured to interface with the stack of first memory die to store and retrieve the data from the stack of first memory die; wherein the logic die includes, a second memory having a faster access time than devices of the stack of first memory die; and wherein the interface circuit is configured to directly access the second memory in response to a first memory request of the plurality of memory requests.

In Example 2, the subject matter of Example 1 includes, wherein the stack of first memory die are a dynamic random-access memory (DRAM) die.

In Example 3, the subject matter of Example 2 includes, wherein the second memory is a static random-access memory (SRAM) device.

In Example 4, the subject matter of Examples 1-3 includes, wherein a command decoder of the interface circuit is configured to receive commands to directly access the second memory.

In Example 5, the subject matter of Examples 1-4 includes, wherein the first command bus is a row command bus.

In Example 6, the subject matter of Example 5 includes, wherein the second command bus is a column command bus.

In Example 7, the subject matter of Examples 1-6 includes, wherein multiple selected bits of the first command bus are configured to provide at least a first command identifier upon a first transition of a clock signal of the first command bus, based on the state of each of the multiple selected bits; and wherein the controller is configured to directly access the second memory device in response to the first command identifier.

In Example 8, the subject matter of Example 7 includes, wherein the multiple selected bits of the command bus comprise at least three bits of the command bus.

In Example 9, the subject matter of Example 8 includes, wherein the multiple selected bits of the command bus comprise the first three bits of the command bus.

In Example 10, the subject matter of Example 9 includes, wherein the first command identifier is provided in response to the first three bits of the first command bus being HIGH, LOW, HIGH on the first transition of the clock signal of the first command bus.

In Example 11, the subject matter of Examples 7-10 includes, wherein the multiple selected bits of the command bus comprise multiple initial bits of the command bus.

In Example 12, the subject matter of Examples 7-11 includes, were in the state of the multiple selected bits of the first command bus are configured to provide the first command identifier in response to a unique combination of states of the multiple selected bits not otherwise present on the command bus.

In Example 13, the subject matter of Example 12 includes, wherein the command bus is compliant with the JEDEC High Bandwidth Memory Standard (JESD235B).

In Example 14, the subject matter of Examples 7-13 includes, wherein the interface circuit is configured to not directly access the second memory device when the first three bits of the first command bus are not HIGH, LOW, HIGH, respectively, upon the first transition of the clock signal of the first command bus.

In Example 15, the subject matter of Examples 7-14 includes, wherein the interface circuit is configured to read data of the second memory device in response to a first state of a bit of the second command bus at a first transition of a clock of the second command bus.

In Example 16, the subject matter of Example 15 includes, wherein the interface circuit is configured to write data to the second memory device in response to a second state of the bit of the second command bus at the first transition of the clock of the second command bus.

In Example 17, the subject matter of Examples 7-16 includes, wherein a first two bits of the second command bus are configured to provide a command identifier upon a first transition of a clock signal of the second command bus; and wherein the interface circuit is configured to directly access the second memory device in response to a first two bits of the second command bus at LOW, HIGH, respectively, upon the first transition of the clock signal of the second command bus.

In Example 18, the subject matter of Example 17 includes, wherein the interface circuit is configured to access the second memory device and to use a buffer of the logic die as a data target in response to a first state of a bit of the second command bus during a second transition of a clock of the second command bus.

In Example 19, the subject matter of Example 18 includes, wherein the interface circuit is configured to initiate the controller to access the stack of first memory die using the buffer of the logic die as a data target in response the bit of the second command bus in a first state during the second transition of a clock of the second command bus.

Example 20 is a method comprising: executing a first memory access operation of a memory device having a stack of memory die using only a first command/address bus to identify the first memory access operation; executing a second memory access operation of the memory device using only a second command/address bus to identify the second memory access operation; and executing a third memory access operation of the memory device using both the first command/address bus and the second command/address bus to identify the third memory access operation, wherein the third memory operation is configured to access second memory of a logic die of the memory device, wherein the second memory is different than the stack of memory die.

In Example 21, the subject matter of Example 20 includes, wherein the stack of memory die includes dynamic random-access memory (DRAM).

In Example 22, the subject matter of Examples 20-21 includes, wherein the second memory is static random-access memory (SRAM).

Example 23, the subject matter of Examples 20-22 includes, wherein the executing the third memory access operation includes: setting a bit of the second command/address bus to one of a first state or a second state during a falling transition of a clock of the second command/address bus; when the bit is set to the first state, using a buffer of the logic die as a data location of the third memory access operation; and when the bit is set to the second state, using a data bus coupling the logic die with a host device as the data location of the third memory access operation.

Example 24 is a logic die for a storage device, the logic die comprising: a first interface to communicate with a stack of memory die of the storage device; a second interface configured to couple with a host device; a second memory directly accessible from the second interface; and processing circuitry to: initiate a first memory access operation of the stack of memory die in response to a first request from the host device, wherein the first request uses only a first command/address bus of the second interface to identify the first memory access operation; initiate a second memory access operation of the stack of memory die in response to a second request from the host device, wherein the second request uses only a second command/address bus of the second interface to identify the second memory access operation; and initiate a third memory access operation of the second memory of the storage device in response to a third request from the host device, wherein the third request uses both the first command/address bus and the second command/address bus to identify the third memory access operation.

In Example 25, the subject matter of Example 24 includes, wherein the third memory access operation includes: a first three bits of the first command/address bus set to logic HIGH, LOW, HIGH, respectively, for a first transition of a clock signal of the first command/address bus to identify the third memory access operation of the second memory; a first two bits of the second command/address bus set to logic LOW, HIGH, respectively for a first transition of a clock signal of the second command/address bus to identify the third memory access operation of the second memory; a third bit of the second command/address bus to a first state for a second transition of the clock signal of the second command/address bus to identify the third memory access operation of the second memory as a read operation; and the third bit of the second command/address bus to a second state for the second transition of the clock signal of the second command/address bus to identify the third memory access operation of the second memory as a write operation.

In Example 26, the subject matter of Example 25 includes, wherein, in response to any one of the second or third memory access operations, the processing circuitry is configured to: use a data bus of the second interface as a data location when a fourth bit of the second command/address bus is set to a third state for the second transition of the clock signal of the second command/address bus; and use a buffer of the logic die as a data location when a fourth bit of the second command/address bus is set to a third state for the second transition of the clock signal of the second command/address bus.

Example 27 is at least one machine-readable medium including instructions that, when executed by processing circuitry, cause the processing circuitry to perform operations to implement of any of Examples 1-26.

Example 28 is an apparatus comprising means to implement of any of Examples 1-26.

Example 29 is a system to implement of any of Examples 1-26.

Example 30 is a method to implement of any of Examples 1-26.

What is claimed is:

1. A logic die for a storage device, the logic die comprising:
    a first interface to communicate with a stack of memory die of the storage device;
    a second interface configured to couple with a host device;
    a second memory accessible from the second interface; and
    processing circuitry configured to:
        initiate a first operation for the stack of memory die in response to a first request from the host device, wherein the first request uses a first command/address bus of the second interface to identify the first operation;
        initiate a second operation for the stack of memory die in response to a second request from the host device, wherein the second request uses a second command/address bus of the second interface to identify the second operation as a read operation or a write operation; and
        initiate a third operation for the second memory in response to a third request from the host device, wherein the third request uses both the first command/address bus and the second command/address bus to identify the third operation for the second memory.

2. The logic die of claim 1, wherein the stack of memory die comprise a dynamic random-access memory (DRAM)

die, and the second memory comprises a static random-access memory (SRAM) device.

3. The logic die of claim 1, wherein the first request is communicated by the second interface using the first command/address bus and without using the second command/address bus, and wherein the second request is communicated by the second interface using the second command/address bus and without using the first command/address bus.

4. The logic die of claim 1, wherein the first operation for the stack of memory die is other than a read operation and is other than a write operation.

5. The logic die of claim 4, wherein the first operation is one or more of a pre-charge operation, a refresh operation, or a power-down operation for the stack of memory die.

6. The logic die of claim 1, wherein the third request uses respective different numbers of bits on the first and second command/address busses to identify the third operation for the second memory.

7. The logic die of claim 1, wherein the third operation includes:
two or more leading bits of a command on the first command/address bus set to identify the third request is for the second memory; and
two or more leading bits of a command on the second command/address bus to identify the third request is for the second memory.

8. The logic die of claim 7, wherein the third operation includes a third bit of the command on the second command/address bus that identifies the third request as a read operation for the second memory.

9. The logic die of claim 7, wherein the third operation includes a third bit of the command on the second command/address bus that identifies the third request as a write operation for the second memory.

10. The logic die of claim 7, wherein the two or more leading bits of the command on the first command/address bus includes a first three bits set to alternating logic levels; and
wherein the two or more leading bits of the command on the second command/address bus includes a first two bits set to different logic levels.

11. The logic die of claim 7, wherein the two or more leading bits of the command on the first command/address bus includes a first three bits set to logic HIGH, LOW, HIGH, respectively; and
wherein the two or more leading bits of the command on the second command/address bus includes a first two bits set to logic LOW, HIGH, respectively.

12. The logic die of claim 1, wherein in response to the second or third operation, the processing circuitry is configured to use, as a target data location, a data bus of the second interface or a buffer of the logic die.

13. The logic die of claim 1, wherein in response to the second or third operation and based on a particular bit value of a command on the second command/address bus, the processing circuitry is configured to use a data bus of the second interface or a buffer of the logic die as a target data location.

14. A method comprising:
executing a first memory operation at a memory device having a stack of memory die in response to a first command on a first command/address bus;
executing a second memory operation at the memory device in response to a second command on a second command/address bus; and
executing a third memory operation of the memory device in response to a third command on the first command/address bus and the second command/address bus, wherein the third memory operation is configured to access second memory of a logic die of the memory device, wherein the second memory is other than the stack of memory die.

15. The method of claim 14, wherein executing the first or second memory operation at the memory device includes using a dynamic random-access memory (DRAM).

16. The method of claim 15, wherein executing the third memory operation to access the second memory includes accessing a static random-access memory (SRAM).

17. The method of claim 15, wherein the executing the third memory operation includes setting a particular bit of the second command/address bus to one of a first state or a second state to indicate a data target location for the third memory operation, wherein the data target location is one of a buffer of the logic die or a host data bus that couples the logic die with a host device.

18. The method of claim 14, wherein the third command comprises a portion of an address for the second memory on the first command/address bus and another portion of the address for the second memory on the second command/address bus.

19. The method of claim 14, wherein the third command includes a leading first three bits on the first command/address bus set to alternating logic levels.

20. The method of claim 19, wherein the third command includes the leading first three bits on the first command/address bus set to logic HIGH, LOW, HIGH, respectively, and the third command includes a leading first two bits on the second command/address bus set to logic LOW, HIGH, respectively.

* * * * *